(12) United States Patent
New et al.

(10) Patent No.: US 7,855,924 B2
(45) Date of Patent: Dec. 21, 2010

(54) DATA PROCESSING MEMORY CIRCUIT HAVING PULL-DOWN CIRCUIT WITH ON/OFF CONFIGURATION

(75) Inventors: David New, Cambridge (GB); Paul Darren Hoxey, Cambridge (GB); David Michael Bull, Cambridgeshire (GB); Shidhartha Das, Ann Arbor, MI (US)

(73) Assignee: ARM Limited, Cambridge (GB)

( * ) Notice: Subject to any disclaimer, the term of this patent is extended or adjusted under 35 U.S.C. 154(b) by 1251 days.

(21) Appl. No.: 11/436,983

(22) Filed: May 19, 2006

(65) Prior Publication Data

US 2007/0268755 A1 Nov. 22, 2007

(51) Int. Cl.
*G11C 7/00* (2006.01)

(52) U.S. Cl. .............. 365/189.12; 365/189.08; 365/190; 365/200

(58) Field of Classification Search ............ 365/189.01, 365/189.19, 189.06, 189.08, 189.11, 190, 365/200
See application file for complete search history.

(56) References Cited

U.S. PATENT DOCUMENTS 6,370,068 B2 * 4/2002 Rhee ..................... 365/196
6,452,859 B1 * 9/2002 Shimano et al. ......... 365/230.06
6,882,555 B2 * 4/2005 Fenstermaker et al. ....... 365/63

* cited by examiner

*Primary Examiner*—J. H. Hur
*Assistant Examiner*—Hien N Nguyen
(74) *Attorney, Agent, or Firm*—Nixon & Vanderhye P.C.

(57) ABSTRACT

A memory circuit includes a memory cell, a pair of conducting lines operable to signal the logic state of the memory cell and read circuitry operable to perform a read operation by detecting a voltage level of at least one of the pair of conducting lines. The memory circuit includes a pull-down circuit having an on configuration in which it is operable to pull-down a voltage level of at least one of the pair of conducting lines so as to affect the read operation and an off-configuration in which the pull-down circuit cannot affect the read operation. Control circuitry is configured to control whether the pull-down circuit is in the on configuration or the off configuration. The memory circuit can be incorporated in a data processing apparatus and a method of operating a memory circuit is provided in which a pull-down circuit is controlled to be in an on configuration or in an off configuration.

16 Claims, 5 Drawing Sheets

DATA PROCESSING MEMORY CIRCUIT HAVING PULL-DOWN CIRCUIT WITH ON/OFF CONFIGURATION

BACKGROUND OF THE INVENTION

1. Field of the Invention

This invention relates to the field of memory circuits. More particularly, this invention relates to memory array read circuitry.

2. Description of the Prior Art

In known memory systems a pair of complementary bit-lines is configurable to be selectively chargeable such that the pulling down of a voltage of one of the pair of complementary bit-lines corresponds to a logic value of one whereas the pulling down voltage of the other one of the pair of complementary bit-lines corresponds to a logic value zero. During a memory read operation both of the pair of complementary bit-lines are precharged to a high voltage and an associated wordline is asserted (activating a row of memory cells). One of the two bit-lines is pulled down in dependence upon the data value stored in an associated memory cell. The speed of pull down of the bit-lines has an influence on the speed of operation on the memory. It is known to increase the rate at which a bit-line is pulled down and to increase the speed of a read operation by providing a pull-down circuit to pull-down the voltage of the pair of bit-lines. However, if the strength of the pull-down device is too strong then errors in the read operations can occur whereas if the pull-down circuit is too weak then the memory is not likely to reach its fill speed potential and lack of efficiency results.

Accordingly there is a need for a more efficient system for performing pull down of bit-lines during read operations i.e. a system capable of properly balancing the requirement for increasing speed of memory operation against the risk of increasing the number of fails in read operations due to a pull-down circuit that is too strong. Providing such a system is made more difficult by the different requirements with regard to the strength of pull-down associated with different memory cells and different memory types.

SUMMARY OF THE INVENTION

According to the first aspect the present invention provides a memory circuit for a data processing apparatus, said memory circuit comprising:

a memory cell;

a pair of conducting lines associated with said memory cell and operable to signal a current logic state of said memory cell;

read circuitry operable to perform a read operation by detecting a voltage level of at least one of said pair of conducting lines and to output a read value indicating said current logic state of said memory cell;

a pull-down circuit having an on-configuration in which it is operable to pull-down a voltage level of at least one of said pair of conducting lines such that said pull-down circuit can affect said read operation and an off-configuration in which said pull-down circuit cannot affect said read operation;

control circuitry operable to control whether said pull-down circuit is in said on-configuration or in said off configuration.

The present invention recognises that providing a pull-down circuit having an on configuration in which it is operable to pull-down the voltage level of at least one of the pair of conducting lines such that the pull-down circuit can affect the read operation and an off configuration in which the pull-down circuit cannot affect the read operation provides the flexibility to adapt a memory circuit according to particular requirements of the read circuitry. Furthermore, provision of control circuitry operable to control whether the pull-down circuit is in the on configuration or the off configuration enables the memory circuit to be fine tuned to increase the efficiency with which pull-down is performed. In particular, the pull-down circuit can be set to an on configuration to increase the speed of memory operation, but if the pull-down is so strong that it gives rise to errors in read operations the pull-down circuit can be switched to the off configuration to restore proper operation of the read circuitry.

In one embodiment the memory circuit comprises a pull-down array comprising a plurality of pull-down circuits and the control circuitry is operable to control which of the plurality of pull-down circuits is in the on configuration and which of the plurality of circuits is in the off configuration. Provision of a plurality of pull-down circuits provides further adaptability of the memory circuit to accommodate different pull-down requirements of different memory circuits. Different ones of the plurality of pull-down circuits can be switched to the on-configuration and the off-configuration to fine-tune the level of pull-down implemented in the memory circuit when operational. Errors due to insufficient read margins can be progressively reduced and eliminated by switching off one or more of the plurality of pull-down circuits. On the other hand, if there is an excessive read margin, which will result in a failure to achieve the full memory speed potential then this can be resolved by using the control circuit to speed up the read operations by switching on more pull-down circuits to increase the speed of pull-down.

In one embodiment at least one of the plurality of pull-down circuits of the pull-down array has a circuit characteristic that differs from a respective circuit characteristic of at least one other of the plurality of pull-down circuits. Providing a range of different pull-down circuit characteristics means that the pull-down array is more adaptable for use in different memory circuits and for different memory cell types. In any given memory circuit there could be mismatches between memory circuit components and it is possible that particular pull-down circuits (depending on their own characteristics) could amplify other mismatches in the memory circuit design. Provision of different circuit characteristics in the pull-down circuits of the pull-down array gives more flexibility so the control circuit can configure the pull-down array to counteract and overcome any mismatches in the memory circuit design.

In one particular embodiment, the circuit characteristic that differs between different ones of the pull down circuits is the transistor width. The greater the transistor width the greater the current drive capability of the associated transistor (larger transistor width represents less resistance in a resistive model of a transistor).

It will be appreciated that the pull-down circuit could comprise a single transistor or an alternative circuit component(s) that serve to pull-down the voltage of at least one of the bit-line pairs so that the threshold voltage of a detecting circuit associated with the pair of bit-lines is reached more quickly. However in one embodiment the pull-down circuit comprises a pair of cross-coupled transistors. This arrangement is effective in providing pull-down yet straightforward to implement.

In one embodiment, the pair of conducting lines (i.e. complementary bit-lines) comprises a conducting line that is pulled down by the memory cell during the read operation and a conducting line that is not pulled down by the memory cell during the read operation. The pull-down circuit is operable to pull-down the voltage level of each of the pair of conducting lines. Thus when a logical value of one is stored by the memory cell (which typically corresponds to the bit-line being held at a high voltage) then the pull-down circuit can be used to increase the speed of pull-down of the complementary bit-line. On the other hand, if a logical zero is stored in the memory cell (which typically involves the complementary bit-line being held at a high voltage level) the pull-down circuit can be used to increase the speed of pull-down of the bit-line.

In one embodiment, the memory circuit comprises compensating circuitry operable to counteract the pull-down of the voltage level by the pull-down circuit on the conducting line that is not being pulled down by the memory cell. This improves the accuracy of the read operations and reduces the likelihood of an erroneous read result being output due as the strength of the pull-down is increased. This is because the compensating circuitry alleviates the undesirable affect of the pull-down circuit of pulling down the conducting line that ought not to be pulled down since. Recall that during a read operation it is desirable that only one of the pair of bit-lines should be pulled down in dependence upon the values stored in the memory cell.

In one embodiment, the control circuitry is operable to fix the pull-down circuit to the on configuration or to the off configuration during manufacture. Thus the memory circuit can be hard-wired during the manufacture stage to suit a particular application of the particular memory array. This enables a given pull-down circuit to be incorporated at an integrated circuit fabrication stage in many different memory circuits and for that pull-down circuit to be fine-tuned following fabrication (but prior to shipping) according to the particular requirements of the memory circuit using the control circuitry to configure the level of pull-down.

In another embodiment, the control circuitry is operable to fix the pull-down circuit to the on configuration or to the off configuration during a built-in self-test (BIST) procedure. This provides a way of accurately assessing the requirements of the memory circuit during a test stage of the memory circuit since test patterns can be written into and read out of the one or more cells of the memory to assess an appropriate level of pull-down that gives rise to more efficient memory read operations yet does not give rise to undesirable failures in read operations.

In yet another embodiment, the control circuit is operable to dynamically control whether the pull-down circuit is in the on configuration or in the off configuration. This means that the memory circuit is adaptable to any change in circuit characteristics that arise from differences in temperature or any other differences in the operational configuration of the memory circuit that are likely to affect the read characteristics of the memory circuit.

In one embodiment, the dynamic control is dependent upon a current operational parameter of the memory circuit. In one particular embodiment of this type, the current operational parameter is an operational voltage. This is useful, for example, in voltage-scaled applications where the memory circuit is operable to function at a plurality of different operating voltages. In this case, when the operating voltage is reduced then circuit characteristics of the memory array are likely to change and could give rise to a failure of read operations if the pull-down circuitry were fixed and there was no control over whether the pull-down circuit was in an on-configuration or an off-configuration. However, this could be overcome by for example setting the pull-down circuit to its off configuration to make the memory circuit operational at a lower voltage.

It will be appreciated that the memory circuit could be any type of memory circuit for example a DRAM memory circuit or a ROM memory circuit etc, but in one embodiment the memory circuit is an SRAM memory circuit.

According to a second aspect the present invention provides a method of operating a memory circuit having a memory cell and a pair of conducting lines associated with said memory cell, said pair of conducting lines being operable to signal a current logic state of said memory cell, said method comprising:

performing a read operation by detecting a voltage level of at least one of said pair of conducting lines and outputting a read value indicating said current logic state of said memory cell;

using a pull-down circuit having an on-configuration in which it is operable to pull-down a voltage level of at least one of said pair of conducting lines such that said pull-down circuit can affect said read operation and an off-configuration in which said pull-down circuit cannot affect said read operation;

controlling whether said pull-down circuit is in said on-configuration or in said off configuration.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
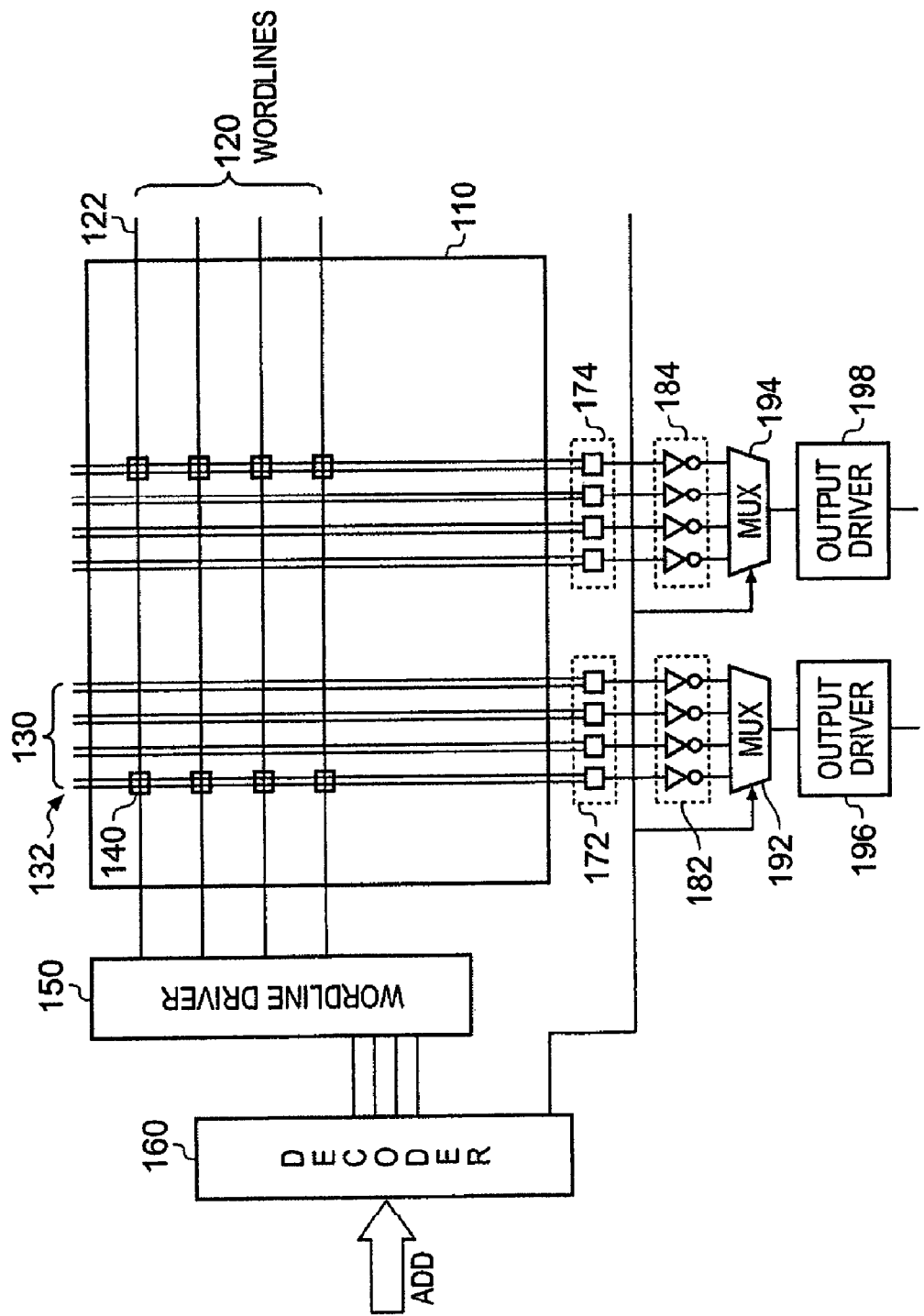
FIG. 1 schematically illustrates the structure of a memory circuit.

FIG. 1 schematically illustrates the structure of a memory circuit 110. The memory 120 comprises an array of memory cells 110; a plurality of word lines 120 (supplying memory rows); a plurality of bit-lines 130 (supplying memory columns); a word line driver 150; an address decoder 160; a series of pull-down circuits 172, 174; a series of inverters 182, 184; a series of multiplexers 192, 194; and a plurality of output drivers 196, 198.

In the memory array 110 a memory cell 140 is formed at an intersection of a word-line 122 with a bit-line pair 132. A given word line 122 connects a row of memory cells 140 whereas the given bit-line pair 132 connects a column of memory cells 140. The word-lines 120 and bit-lines 130 are conducting lines that can be activated by supplying a voltage to them. The word-line driver 150 selectively activates a given word-line 122 in order to perform a read operation from or a write operation to a given memory cell 140. The decoder 160 is responsive to an address supplied from a processor (not shown) to decode an address value to access an appropriate memory cell 140 of the memory array 110.

The bit-lines 130 are arranged into groups of four bit-line pairs bit-line and complementary bit-line) and each group has an associated multiplexer 192, 194. Each of the multiplexers 192, 194 enables one of the four bit-line pairs with which it is associated to be selected to output a read value from an associated memory cell 140.

Each of the four bit-line pairs is associated with a respective pull-down circuit in the pull-down circuitry 172. The pull-down circuit supplies the data value on the bitline of the bitline pair to an inverter of the inverter circuitry 182. The inverter effectively reads the data value from the bitline. The input of the inverter is attached to the bitline. Prior to a read operation, the bitline is high (pre-charged) so the inverter output is low. If the bitline is indicating that a zero is stored in the associated memory cell 140, then the bitline voltage will fall during the read operation. When the bitline voltage falls to the threshold voltage of the inverter then the output of the inverter will rise. If, on the other hand, the bitline is indicating that a one is stored in the associated memory cell 140, during the read operation the bitline will fall slightly due to the effect of the pull-down circuitry 172, but will be pulled back up again (see description of FIG. 2B below—signal line 220). In this case, the slight pull-down does not result in the threshold voltage of the inverter being reached. Accordingly, the output of the inverter will remain low, as it was in the pre-charged state.

The outputs of the four inverters of the inverter circuitry 182 are supplied to the multiplexer 192, which selects an output from one of the four bitlines in dependence upon a control signal supplied to the multiplexer 192 by the decoder 160.

The output of the multiplexer 192 is supplied to the respective output driver 196 for output to the processor. Similarly, the multiplexer 194 selectively reads the value from one of the four inverters of the inverter circuitry 184 and supplies that value to the respective output driver 194 for output to the processor.

Each pair of complementary bit-lines is associated with a column of memory cells. In the quiescent state a pair of bit-lines is initially pre-charged high. In order to perform a memory read operation the word line driver 150 activates a given word line 122 whereupon the word line goes to a high voltage and one of the two complementary bit-lines associated with a memory cell that is to be read will be pulled down. Which one of the complementary bit-lines is pulled down depends on the logic value that is currently stored in the memory cell The voltage swing of a pulled down bitline in the circuit of FIG. 1 is large compared with an arrangement that uses sense-amps rather than inverters in the read circuitry. In particular, the voltage swing in the circuit of FIG. 1 is typically about half of the full supply voltage and eventually one of the bitlines of the bitline pair is likely to fall by the entire supply voltage.

Figure 2A:
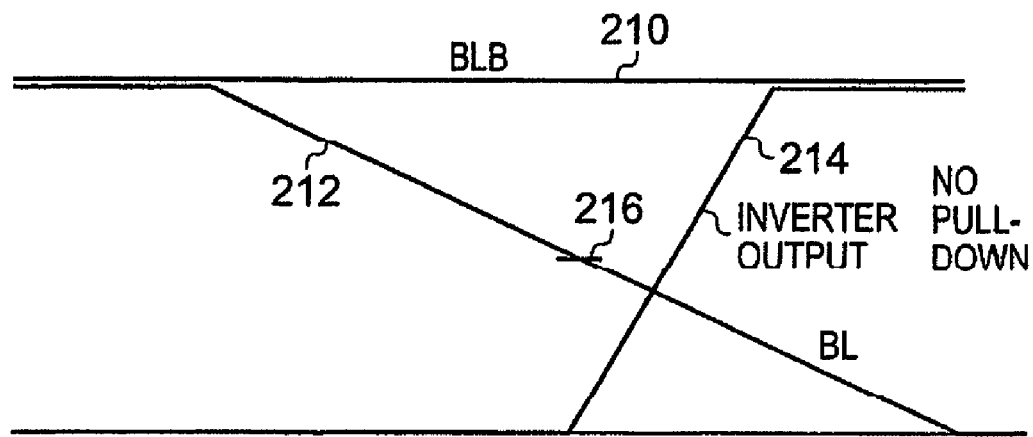
FIGS. 2A to 2C schematically illustrate the effects of pull-down circuitry in the memory cell read circuitry.
Figure 2B:
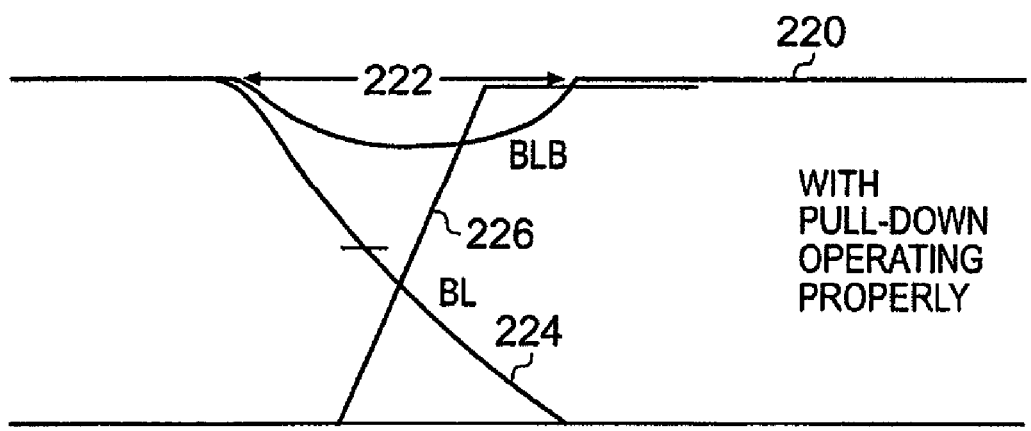
Figure 2C:
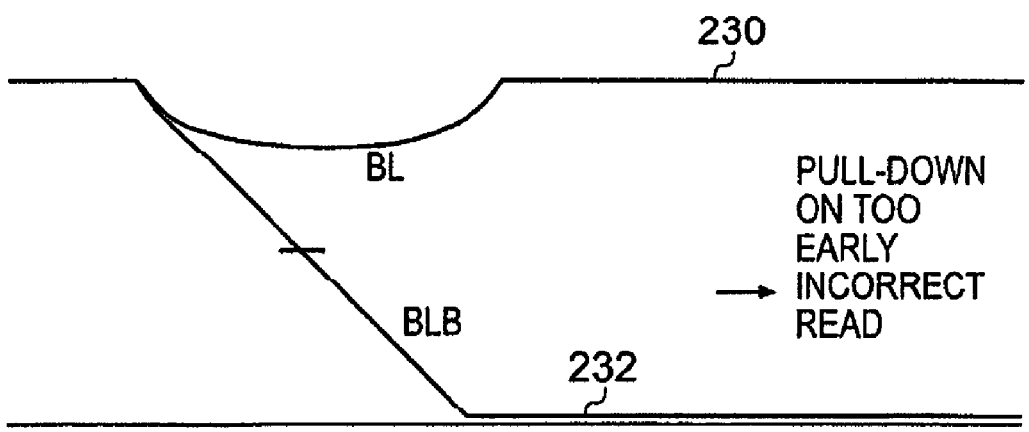

FIGS. 2A to 2C schematically illustrate the effect of pull-down circuitry. During a memory read operation in an SRAM memory cell, a read operation begins with pre-charging both bit-lines of a bit-line pair to high values and then asserting the associated word line. Depending on the logical values stored by the memory cell one of the two bit-lines is pulled down by the cell. In particular, if the memory cell is storing a logical 1 then the complementary bit-line is pulled down whereas the bit-line is held at a high value. However when the memory cell is storing a logical zero then the bit-line is pulled down whereas the complementary bit-line is held at a high value. FIGS. 3A to 3C show a situation where a logical zero is stored in a memory cell.

FIG. 2A shows a situation where no pull-down is provided on the memory cell read circuitry. This figure shows signal values for a complementary bit-line 210, a bit-line 212, and an output of the read circuitry of the memory cell (i.e. an inverter output) 214. Since the memory cell is storing a logical zero it can be seen that the complementary bit-line remains at a high voltage so that signal line 210 is constantly at a high value whereas the bit-line signal 212 remains constant at a high voltage for a predetermined time and then begins a substantially linear decrease to a low voltage level. As can be seen from signal line 214, the read circuitry has a threshold voltage 216 at which it begins to recognise the stored data value. In the case of FIG. 2A it can be seen that the read circuitry output 214 starts at a low value and switches such that it transitions from a low value to a high value at a point in time when the bit-line signal 212 has fallen to the threshold voltage value 216.

The speed with which the read circuitry recognises the stored data value is determined by the gradient of the bit-line signal 212 as it falls from a high value to a low value. In particular, the steeper the gradient, the earlier the time at which the read circuitry recognises the stored logic value. This means that the access time of the memory is improved. Also, the longer it takes for a stored logic value to be recognised then the less time there is in a read cycle for the bit-lines to be recharged to the pre-charge voltage. A longer read-cycle timing can result in a reduced operating frequency of the processor if the critical path in the read cycle includes the bit-line reading delay (i.e. access time). An important advantage of employing stronger pull-down circuitry is that the read data is output faster, which leaves more time in the clock cycle for external circuitry to operate.

FIG. 2B schematically illustrates signal values on a bit-line and complementary bit-line in the case where the pull-down circuitry 172, 174 (see FIG. 1) is operating correctly. The signals on FIG. 2B comprise a complementary bit-line signal 220, a bit-line signal 224 and an inverter output signal 226. The effects of the pull-down circuitry 172, 174 can be seen in both the profiles of both the complementary bit-line signal 220 and in the bit-line signal 224. In particular, the effect of the pull down circuitry 172, 174 on the complementary bit-line signal 220 is to cause a slight dip in voltage in the region 222 on the complementary bit-line. The dip in voltage 222 coincides with the time period when the bit-line signal 224 is falling from a high value to a low value. The effect of the pull-down circuitry 172, 174 on the bit-line signal 224 is to increase the gradient of the falling bit-line relative to the gradient of the signal line 216 (i.e. it causes the voltage of the bit-line to be pulled down faster than it otherwise would be). This increase in the speed of pull-down of the bit-line signal 224 results in the bit-line reaching the inverter threshold voltage 216 at an earlier point in time than the corresponding bit-line in FIG. 2A. This can be seen by the fact that the inverter output signal 226 transitions from a low value to a high value at an earlier point than the corresponding signal in FIG. 2A. The effect of the pull-down is thus to increase the speed of the read operation. The earlier read allows for more time for the bit-lines to recharge to their pre-charge voltages and reduces the read cycle timing.

FIG. 2C schematically illustrates signal values for a bit-line and complementary bit-line in the case where the pull-down circuitry 172, 174 is too strong or equivalently if the pull-down is switched on too early. In this case it can be seen that instead of pulling down the bit-line voltage to a low value consistent with the memory cell storing a logical zero, the effect of the pull-down has been to override the value stored in the memory cell such that the complementary bit-line has been pulled down from a high to a low value instead of the bit-line itself. This situation can arise when parts of the circuit design are out of balance, for example, if the pull-down circuits are turned on too early and they have some sort of mismatch. Such a mismatch would have the consequence that the bitline with the strongest pull-down circuit is pulled down regardless of the data value stored in the associated memory cell.

In FIG. 2C the roles of the bit-line and the complementary bit-line have effectively been reversed as it can be seen from signal line 230 that the bit-line ultimately remains at a high value although it has a dip that coincides with the period of time when the complementary bit-line is falling. The complementary bit-line signal 232 falls from a high value to a low value instead of remaining at a high signal value. Thus although the pull-down circuitry 172, 174 can be effective in improving the efficiency of read operations of the memory cell, there is a potential disadvantage that the pull-down circuitry can overpower the effect of the data values stored in the memory cell.

Figure 3:
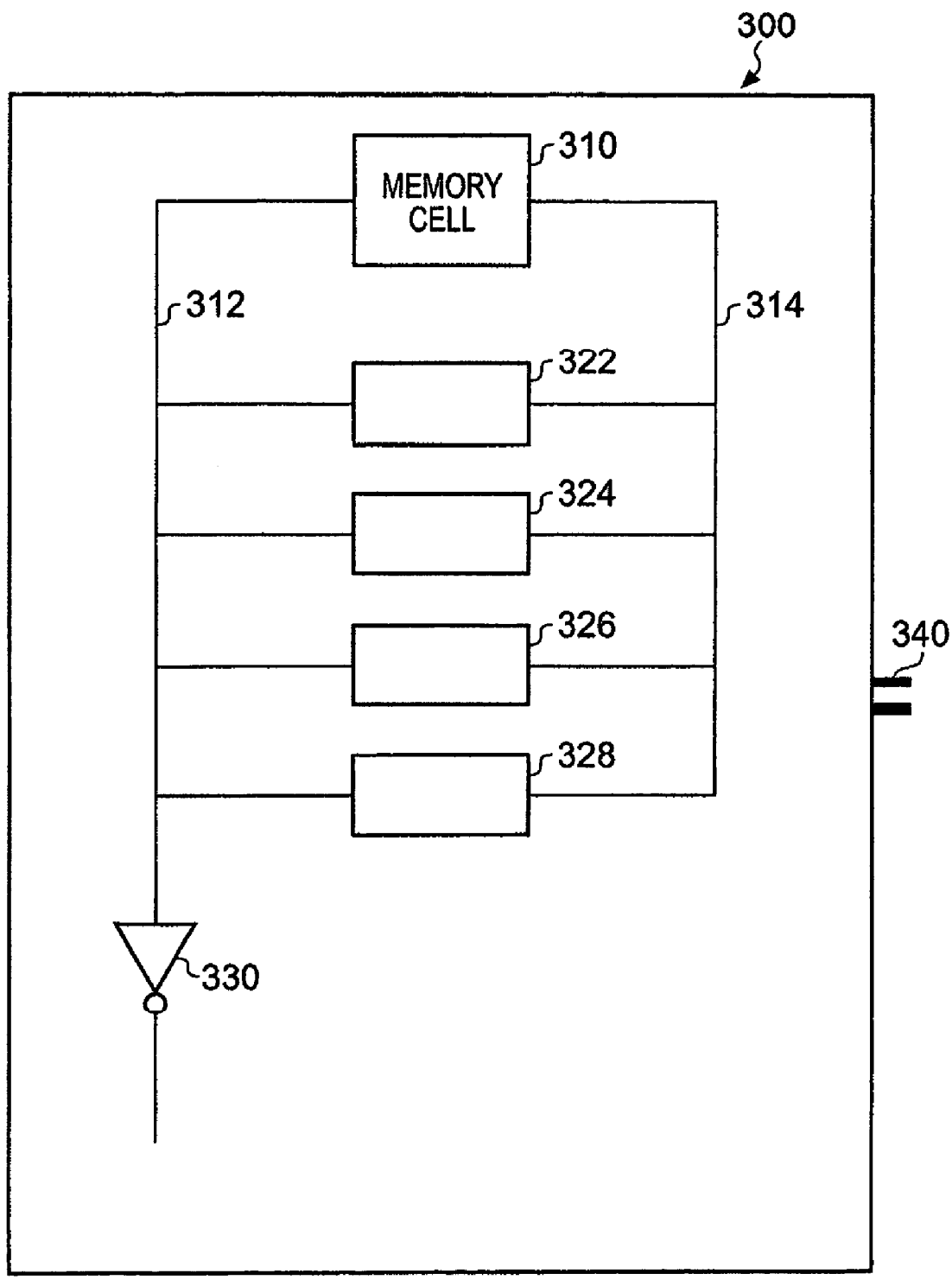
FIG. 3 schematically illustrates a memory array in which bit-line pairs associated with a memory cell have a plurality of pull-down devices to increase the speed with which the bit-lines fall.

FIG. 3 schematically illustrates a memory array 300 in which bit-line pairs associated with a memory cell have a plurality of pull-down devices on the bit-lines to increase the speed with which the bit-lines fall. The memory array 300 comprises a plurality of memory cells (only one of which is shown). The circuitry associated with the memory cell 310 comprises a plurality of pull down devices 322, 324, 326 and 328 arranged between the bit-line 312 and a complementary bit-line 314. Reading of the values stored in the memory cell is performed by an inverter 330 situated on the bit-line 312. The function of this inverter in reading the value stored in a memory cell corresponding to the bitline is as described above in relation to the inverter circuitry 182 of FIG. 1. The memory array has a pair of pins 340 that are used to configure the memory array to control which of the four pull-down devices 322, 324, 326, 328 are on or off at a given time. The pins 340 are used at the stage of the circuit manufacture to appropriately configure the pull-down arrangement.

Note that the array of four pull-downs 322, 324, 326, 328 are not necessarily associated with a single memory cell 310, but instead may be associated with a column of memory cells as illustrated in FIG. 1. The pull-down devices 322, 324, 326, 328 in this example embodiment have identical circuit characteristics, but in alternative embodiments different pull-down devices differ in their circuit characteristics, e.g. by having different transistor widths.

As explained in relation to FIGS. 2A to 2C, the purpose of the pull-down devices is to increase the speed with which the bit-lines fall during a read operation in order that the threshold voltage of the bit-line sensing circuitry is reached more quickly. However, if the overall strength of the pull-down devices is so strong that it results in the wrong bit-line being pulled down (i.e. results in an erroneous read operation) then this is an undesirable result Errors can be caused by offsets as discussed above and by mismatches in the pull-down devices 322, 324, 326, 328. Thus there is a need to create a balance between increasing the speed of the bit-line pull-down yet retaining the accuracy of the read operations. The circuit of FIG. 4 enables this balance to be achieved by providing a plurality of pull-down devices 322, 324, 326, 328 in parallel between the bit-line 312 and the complementary bit-line 314 and provides control circuitry in the form of the pair of pins 340 to control whether each of these pull down devices are in an on-configuration or an off-configuration. Thus the circuit can be configured to improve the efficiency of operation of the memory by increasing the speed of the pull-down yet to ensure that reliable read results are obtained.

Provision of a plurality of pull-down devices rather than a single large pull-down device means that if an incorrect read value is obtained then the errors in operation of the memory can be corrected by simply disabling one or more of the pull-down devices to improve the chances of a correct read. Alternatively, if it is established that the read operations are being accurately performed yet it is desired to further improve the speed of operation of the memory (i.e. to perform faster reads) then one or more pull-down devices can be switched from an off-configuration to an on configuration. In this particular arrangement there is a control mechanism 340 to set at the manufacturing stage the number of pull-down devices that are active (i.e. in an on-configuration). However, in alternative embodiments, control circuitry is provided to control which of the pull-down devices are in an on/off configuration via a feedback mechanism that is active during normal operation of the memory. In yet further alternative embodiments, the on/off configuration of the pull-down devices is set following a built-in-self-test (BIST) procedure.

Figure 4:
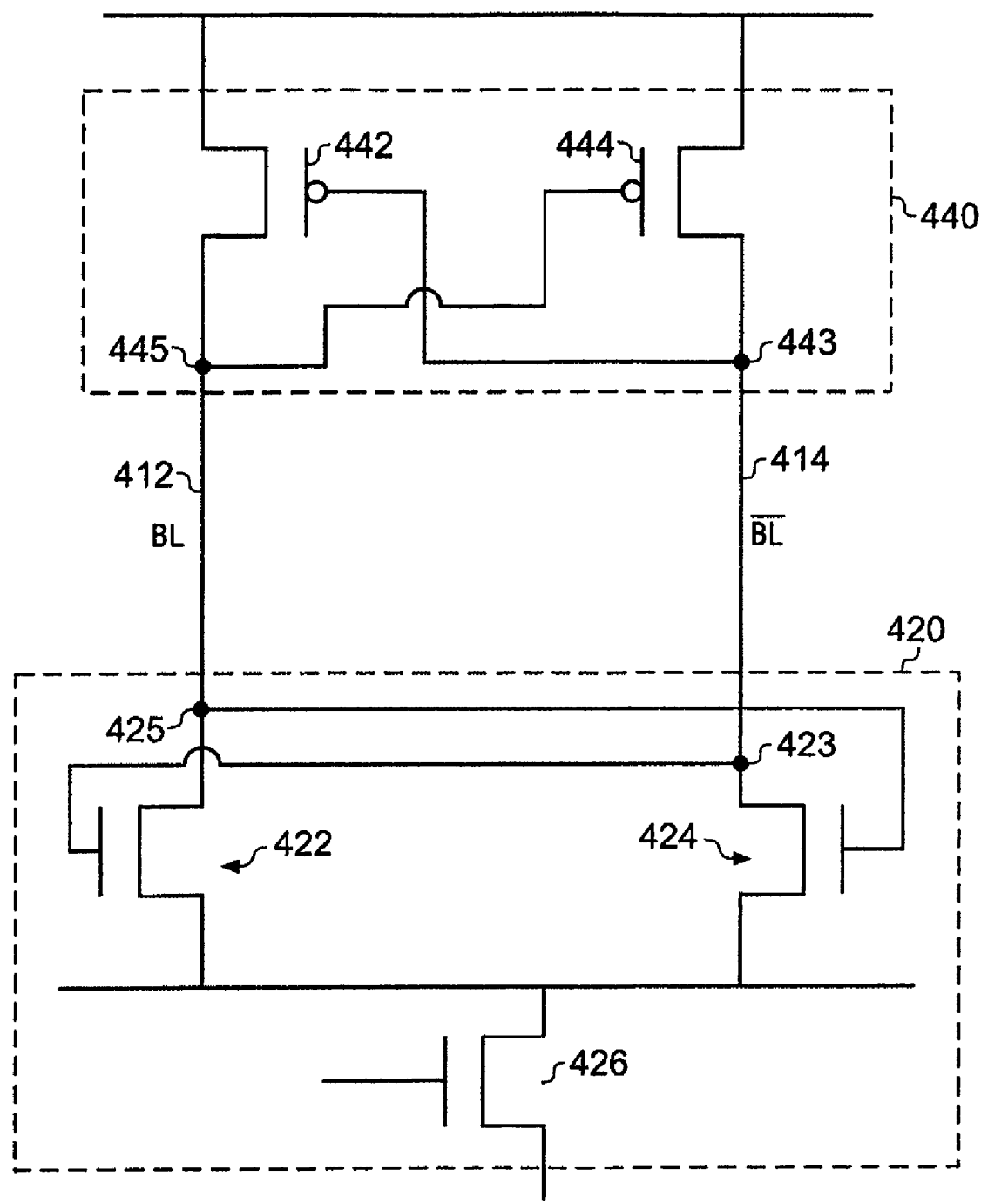
FIG. 4 schematically illustrates circuitry of a pull-down device together with compensating circuitry provided between a bit-line pair.

FIG. 4 schematically illustrates circuitry of the pull-down device 420 together with compensating circuitry 440 provided between a bit-line pair comprising a bit-line 412 and a complementary bit-line 414.

The pull-down circuitry 420 represents circuitry provided in one of the pull-down devices 322, 324, 326, 328 of FIG. 3. The pull-down circuitry 420 comprises an NMOS transistor 422 associated with the bit-line 412 and a second NMOS transistor 424 associated with the complementary bit-line 414. The two NMOS transistors 422, 424 are cross-coupled. The gate of the first NMOS transistor 422 is connected via node 423 to the complementary bit-line 414 whereas the gate of the NMOS transistor 424 is connected to the bit-line 412 via the node 425. A further NMOS transistor 426 is arranged on a line connecting the outputs of the first NMOS transistor 422 and the second NMOS transistor 424.

In operation, the transistor 426 is turned on to enable the pull down circuit at the same time as the wordline is turned on. As both the bit-line BL and the complementary bit-line are both at vdd, transistors 422 and 424 are on. The bit-line that is reading a zero from the memory cell will fall faster than the bit-line that is reading the one. This means the bit-line that is reading a zero will reach the threshold value of the sensing inverter 330 first. Depending on circuit conditions, the bit-line that reads a one may also reach the inverter threshold voltage. However, this should happen after the first bit-line has fallen. So with this circuit the read value is obtained by finding out which inverter is switched first.

Devices 422 and 424 are cross coupled, i.e. the drain of one device is connected to the gate of the other. In this circuit as one of the bit-lines will fall faster than the other then the pull down on the opposite bit-line will be weakened. For example, if a zero is being read from bit-line BL then this line will fall faster than the complementary bit-line. As BL falls the gate-source voltage of transistor 424 is less so the complementary bit-line will be pulled down less. Eventually as BL falls below the threshold voltage of 424, this device will turn off, and the complementary bit-line will not be pulled down at all. So this cross coupling will have the benefit of slowing down the pull down of the complementary bit-line and there will be a longer time difference between the first and second inverter switching.

In order to simplify the design, cross coupled PMOS transistors 442 and 444 can also be attached to the bit-line. The purpose of these devices is to pull up the bit-line that is reading a one. This pulling up will start to happen when the bit-line that is reading a zero falls below the threshold voltage of the PMOS device. Also at this point the bit-line that is reading a one is being pulled down less, as explained in the previous paragraph The pull up on this bit-line increases, and the pull down decreases, until eventually the line gets pulled back up to Vdd. The waveform for this is shown as 220 in FIG. 2B. The bit-line that is reading a zero will continue falling, as in waveform 224 in FIG. 2B.

Figure 5:
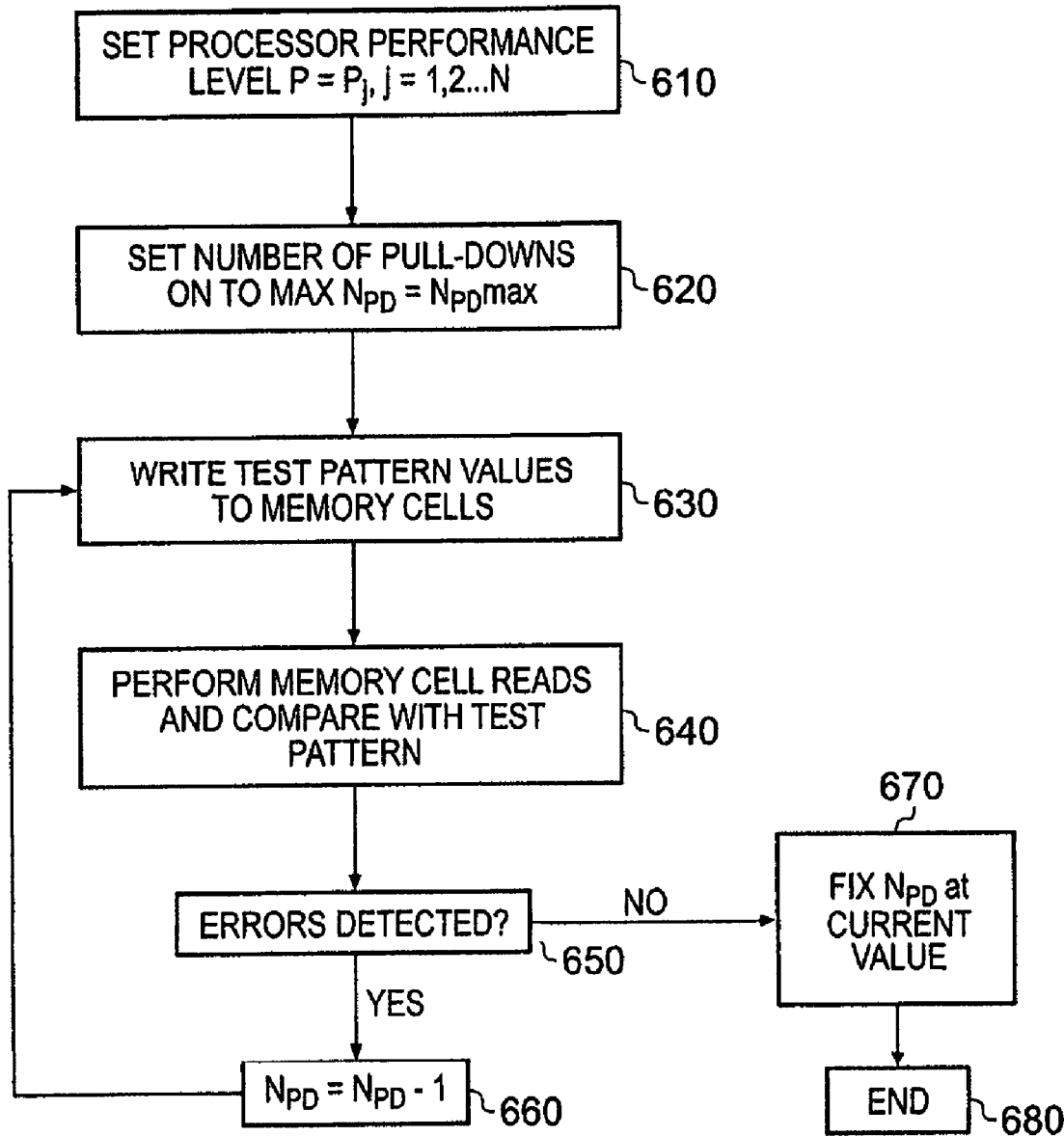
FIG. 5 is a flow chart that schematically illustrates how the control circuitry serves to configure the memory circuit in the data processing apparatus

Because of the addition of the pull up devices the inverter of the bit-line that is reading a one doesn't turn on as its threshold voltage is not reached. This means that in this circuit only one inverter is needed, attached to either bit-line As explained with reference to FIG. 2C, the pull-down circuit 420 serves to pull down not only the voltage of the bit-line that it is desired to pull-down (considering the currently stored value in the memory cell), but also pulls down the corresponding bit-line. The fact that it is not just the bit-line that it is intended to be pulled down that is acted on by the pull-down circuit 420 can lead to errors in read results as illustrated in FIG. 2C. The compensating circuitry 440 serves to counteract the pull-down of the voltage level by the pull-down circuit 420 on the one of the pair of bit-lines (i.e. conducting lines) that is not being pulled down by the memory cell. The compensating circuitry 440 comprises a first PMOS transistor 442 associated with a bit-line 412 and a second PMOS transistor 444 associated with the complementary bit-line 414. These PMOS transistors 442, 444 are cross-coupled in the sense that the input to the gate of PMOS transistor 442 is coupled to the complementary bit-line 414 at the node 443 whereas the input to the gate of PMOS transistor 444 is coupled to the bit-line 412 at the node 445. In these PMOS transistors 442, 444 the signal carriers are holes i.e. the absence of an electron. The current in the PMOS transistor flows opposites in an opposite direction to that in the NMOS transistors 422, 424 so that the PMOS transistor is off when its gate voltage is high (above threshold V) and on when its gate voltage is low (below threshold V). The compensating circuitry 440 functions to prevent the pull-down of the "wrong" bit-line as follows. The bitline (of the bitline pair) that is reading a logical value of zero from the associated memory cell will fall faster than a bitline that is reading a logical value of one from the associated memory cell. If the bit-line is reading a zero then PMOS 444 of the compensating circuitry 440 will turn on. Accordingly, the compensating circuitry 440 will pull up the complementary bitline FIG. 5 is a flow chart that schematically illustrates how the control circuitry serves to configure the memory circuit to control which of the plurality of pull-down circuit is in an on configuration and which of the plurality of pull-down circuits is in an off configuration. In this particular arrangement, the memory circuit is part of a processor that is operable at a plurality of different processing performance levels, the desired performance level being selectable according to the current processing workload. This type of data processing device was illustrated in FIG. 6 described above.

The process begins at stage 610 when the processor performance level is set at one above a plurality of one of the plurality j of predetermined values, for example the voltage supply to the memory circuit is set at one of a plurality of different values. Next at stage 620 the number of pull-downs in the pull-down circuit associated with the pair of bit-lines is set to the maximum possible number i.e. $N_{PD}=N_{PD}$ max marks. At stage 630 a series of memory tests is performed where predetermined test patterns are written to a series of memory cells. At stage 640 the values written to the memory cells according to the test patterns at stage 630 are read from those memory cells and compared with the known test patterns to determine whether the read operations were accurate or inaccurate. Such memory testing is known as built-in self-test (BIST).

At stage 650 it is determined whether or not errors have been detected in the read operation that are likely to be attributable to the pull-own provided by the plurality of pull-down circuits (see pull-down devices 322, 324, 326, 328 in FIG. 3) being too strong. If errors are detected indicating that the current pull-down configuration is leading to inaccurate read operations then the process proceeds to stage 660 whereupon the number of pull-down devices currently set to the on configuration is reduced from the maximum number to the maximum number minus one. The process then returns to stage 630 whereupon the test values are again applied and the test sequence is repeated. If however at stage 650 it is determined that no significant errors in read operation have resulted from the current configuration of pull-down devices then the number of pull downs is fixed at the current value at stage 670 and the process ends.

The whole process is repeated for each of the possible processor performance levels j=1, 2, . . . N. The appropriate configuration of pull-down devices is stored by the processor 510 such that the pull-down configuration can be changed dynamically each time the processor performance level changes from one value to another. The dynamic changes to the configuration of the pull down circuitry in the embodiment of FIG. 6 represents an alternative to the embodiment of FIG. 3 in which the configuration of the pull-downs was fixed at the manufacturing stage via the pair of pins 340.

Although illustrative embodiments of the invention have been described in detail herein with reference to the accompanying drawings, it is to be understood that the invention is not Limited to those precise embodiments, and that various changes and modifications can be effected therein by one skilled in the art without departing from the scope and spirit of the invention as defined by the appended claims.

We claim:

1. A memory circuit for a data processing apparatus, said memory circuit comprising:
   a memory cell;
   a pair of conducting lines associated with said memory cell and operable to signal a current logic state of said memory cell;
   read circuitry operable to perform a read operation by detecting a voltage level of at least one of said pair of conducting lines and to output a read value indicating said current logic state of said memory cell;
   a pull-down circuit having an on-configuration in which it is operable to pull-down a voltage level of at least one of said pair of conducting lines such that said pull-down circuit can affect said read operation and an off-configuration in which said pull-down circuit cannot affect said read operation;
   control circuitry operable to control whether said pull-down circuit is in said on-configuration or in said off configuration.

2. Memory circuit according to claim 1, comprising a pull-down array having a plurality of said pull-down circuits and wherein said control circuitry is operable to control which of said plurality of pull-down circuits is in said on-configuration and which of said plurality of pull-down circuits is in said off-configuration.

3. Memory circuit according to claim 2 wherein at least one of said plurality of pull-down circuits of said pull-down array has a circuit-characteristic that differs from a respective circuit-characteristic of at least one other of said plurality of pull-down circuits.

4. Memory circuit according to claim 3, wherein said pull-down circuits comprise a transistor and wherein said circuit-characteristic is a transistor width.

5. Memory circuit according to claim 1, wherein said pull-down circuit comprises a pair of cross-coupled transistors.

6. Memory circuit according to claim 1, wherein said pair of conducting lines comprises a conducting line that is pulled down by said memory cell during said read operation and a conducting line that is not pulled down by said memory cell during said read operation and wherein said pull-down circuit is operable to pull down a voltage level of both of said pair of conducting lines.

7. Memory circuit according to claim 6, comprising compensating circuitry operable to counteract said pull-down of said voltage level by said pull-down circuit on said conducting line that is not being pulled down by said memory cell.

8. Memory circuit according to claim 1, wherein said control circuitry is operable to fix said pull-down circuit to said on-configuration or to said off-configuration during manufacture.

9. Memory circuit according to claim 1, wherein said control circuitry is operable to fix said pull-down circuit to said on-configuration or to said off-configuration during a built-in self-test procedure.

10. Memory circuit according to claim 1, wherein said control circuitry is operable to dynamically control whether said pull-down circuit is in said on-configuration or in said off configuration.

11. Memory circuit according to claim 10, wherein said dynamic control is dependent upon a current operational parameter of said memory circuit.

12. Memory circuit according to claim 11, wherein said current operational parameter is an operational voltage.

13. Memory circuit according to claim 1, wherein said memory circuit is an SRAM memory circuit.

14. A data processing apparatus comprising a memory circuit according to claim 1.

15. A method of operating a memory circuit having a memory cell and a pair of conducting lines associated with said memory cell, said pair of conducting lines being operable to signal a current logic state of said memory cell, said method comprising:
performing a read operation by detecting a voltage level of at least one of said pair of conducting lines and outputting a read value indicating said current logic state of said memory cell;
using a pull-down circuit having an on-configuration in which it is operable to pull-down a voltage level of at least one of said pair of conducting lines such that said pull-down circuit can affect said read operation and an off-configuration in which said pull-down circuit cannot affect said read operation;
controlling whether said pull-down circuit is in said on-configuration or in said off configuration.

16. A memory circuit for a data processing apparatus, said memory circuit comprising:
means for storing a data value;
means for conducting signals associated with said means for storing and operable to signal a current logic state of said means for storing;
means for reading operable to perform a read operation by detecting a voltage level of at least a portion of said means for conducting and to output a read value indicating said current logic state of said means for storing;
means for pulling-down voltage having an on-configuration in which it is operable to pull-down a voltage level of at least a portion of said means for conducting such that said means for pulling-down said read operation and an off-configuration in which said means for pulling-down cannot affect said read operation;
control circuitry operable to control whether said pull-down circuit is in said on-configuration or in said off configuration.

* * * * *